(12) United States Patent
Lin

(10) Patent No.: US 6,799,870 B2
(45) Date of Patent: Oct. 5, 2004

(54) SIDEWAY-PROJECTING LIGHT EMITTING DIODE STRUCTURE

(75) Inventor: Ming-Te Lin, Taipei Hsien (TW)

(73) Assignee: Para Light Electronics Co. Ltd., Taipei (TW)

(*) Notice: Subject to any disclaimer, the term of this patent is extended or adjusted under 35 U.S.C. 154(b) by 0 days.

(21) Appl. No.: 10/246,682

(22) Filed: Sep. 19, 2002

(65) Prior Publication Data

US 2004/0057254 A1 Mar. 25, 2004

(51) Int. Cl.[7] ............................................. F21V 29/00
(52) U.S. Cl. ..................... 362/294; 362/373; 362/545; 362/555; 362/800
(58) Field of Search ................................ 362/800, 545, 362/294, 373, 555

(56) References Cited

U.S. PATENT DOCUMENTS

| | | | | |
|---|---|---|---|---|
| 4,267,559 A | * | 5/1981 | Johnson et al. | 357/81 |
| 5,782,555 A | * | 7/1998 | Hochstein | 362/373 |
| 5,785,418 A | * | 7/1998 | Hochstein | 362/373 |
| 5,857,767 A | * | 1/1999 | Hochstein | 362/294 |
| 6,441,943 B1 | * | 8/2002 | Roberts et al. | 359/267 |
| 6,472,823 B2 | * | 10/2002 | Yen | 315/112 |

* cited by examiner

Primary Examiner—Thomas M. Sember
Assistant Examiner—Jacob Y. Choi
(74) Attorney, Agent, or Firm—Troxell Law Office PLLC

(57) ABSTRACT

A sideway-projecting light emitting diode (LED) includes an enclosure made of a light-transmitting material having first and second opposite side faces. The first side face forms a light-focusing portion. First and second conductive terminals are fixed in the enclosure and have tails extending beyond the second side face. A support member made of conductive materials has an inner end fixed in the enclosure between the first and second terminals and a remote end extending beyond the side face. A bowl is formed on the inner end of the support member for receiving and retaining a chip substantially confronting the light-focusing portion and electrically connected to the first and second terminals. A heat dissipation plate is mounted to the remote end of the support member for enhancing heat dissipation of the light emitting diode which in turn allows for increased power consumption of the light emitting diode and increased brightness of the light emitted from the light emitting diode. By edge-mounting the light emitting diode to an edge of a circuit board with the tails of the terminals soldered to the circuit board, light emitted from the chip is allowed to project through the light-focusing, portion in a sideway direction with respect to the circuit board.

6 Claims, 14 Drawing Sheets

SIDEWAY-PROJECTING LIGHT EMITTING DIODE STRUCTURE

FIELD OF THE INVENTION

The present invention generally relates to the field of light emitting diode (LED), and in particular to an LED structure allowing for projecting light in a sideway direction.

BACKGROUND OF THE INVENTION

Light emitting diodes (LEDs) are commonly used in electronic industry for a variety of applications, among which light source is one of the most common applications of the LEDs. Conventionally, the LEDs are mounted on a circuit board to project light in a direction substantially normal to the circuit board. FIG. 11 of the attached drawings shows an example of the conventional LEDs, wherein the LED comprises a substrate from which two terminals extend. A chip is mounted to one of the terminals and is connected to another terminal by a lead. The terminals are mounted to a circuit board and are electrically connected to conductor patterns of the circuit board to supply electrical power to the LED. The terminals are mounted to the circuit board in a standing manner with the chip facing away from the circuit board. Thus, the light emitted from the LED is directed away from the circuit board in a direction substantially normal to the circuit board.

FIG. 12 of the attached drawings shows a modification of the conventional LED, wherein a heat dissipater plate is mounted to one of the terminals of the LED for enhancing heat dissipation of the LED. Similarly, the light emitted from the LED is directed upward away from the circuit board. Thus, the light can only be projected away from the circuit board in a direction substantially normal to the circuit board.

As a consequence, such conventional LEDs cannot be used in applications whereby light projected in a sideway direction with respect to a circuit board is required. In addition, the heat dissipater plate of the conventional LED is mounted to the terminal between the LED and the circuit board. Further increasing the size of the heat dissipater plate can only be done in a transverse direction. This may cause undesired interference with other parts or may be further constrained by the other parts. Thus, increasing the size of the heat dissipater plate in order to enhance the heat dissipation is in general very difficult in the conventional LEDs.

FIGS. 13 and 14 show two examples of conventional LEDs that allow for sideway projection of the light emitted from the LEDs. The LEDs comprise terminals extending in a direction substantially normal to the light projection direction of the LEDs. Thus, when the terminals are mounted to a circuit board in a standing manner, the light emitted from the LEDs is projected in a sideway direction with respect to the circuit board. However, no heat dissipation means can be formed with the LEDs for enhanced heat dissipation, which in turn allows for increase of power consumption of the LEDs. Thus, the performance of the LEDs in emitting high power light is subject to limitation.

It is thus desired to provide a sideway-projecting light emitting diode structure for overcoming the above problems.

SUMMARY OF THE INVENTION

An object of the present invention is to provide a sideway-projecting light emitting diode that allows light emitted from the light emitting diode to be projected in a sideway direction with respect to a circuit board to which the light emitting diode is mounted.

Another object of the present invention is to provide a sideway-projecting light emitting diode structure comprising a heat dissipation member of different shapes and sizes for providing excellent and optimum heat dissipation to the light emitting diode in order to improve the overall performance of the light emitting diode.

To achieve the above objects, in accordance with the present invention, there is provided a sideway-projecting light emitting diode (LED) comprising an enclosure made of a light-transmitting material having first and second opposite side faces. The first side face forms a light-focusing portion. First and second conductive terminals are fixed in the enclosure and have tails extending beyond the second side face. A support member made of conductive materials has an inner end fixed in the enclosure between the first and second terminals and a remote end extending beyond the side face. A bowl is formed on the inner end of the support member for receiving and retaining a chip substantially confronting the light-focusing portion and electrically connected to the first and second terminals. A heat dissipation plate is mounted to the remote end of the support member for enhancing heat dissipation of the light emitting diode which in turn allows for increased power consumption of the light emitting diode and increased brightness of the light emitted from the light emitting diode. By edge-mounting the light emitting diode to an edge of a circuit board with the tails of the terminals soldered to the circuit board, light emitted from the chip is allowed to project through the light-focusing portion in a sideway direction with respect to the circuit board.

BRIEF DESCRIPTION OF THE DRAWINGS

The present invention will be apparent to those skilled in the art by reading the following description of the preferred embodiments thereof, with reference to the attached drawings, in which.

DETAILED DESCRIPTION OF THE PREFERRED EMBODIMENTS

Figure 1:
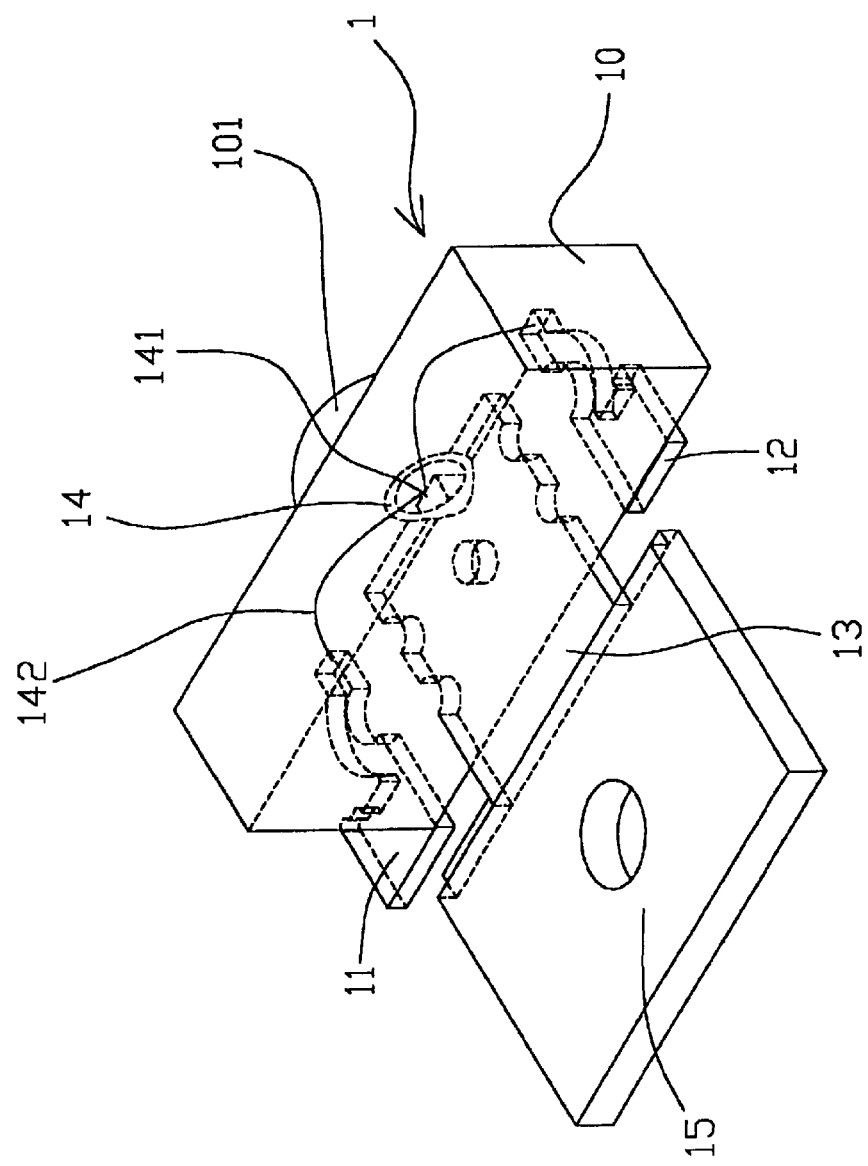
FIG. 1 is a perspective view of a light emitting diode (LED) constructed in accordance with the present invention.
Figure 2:
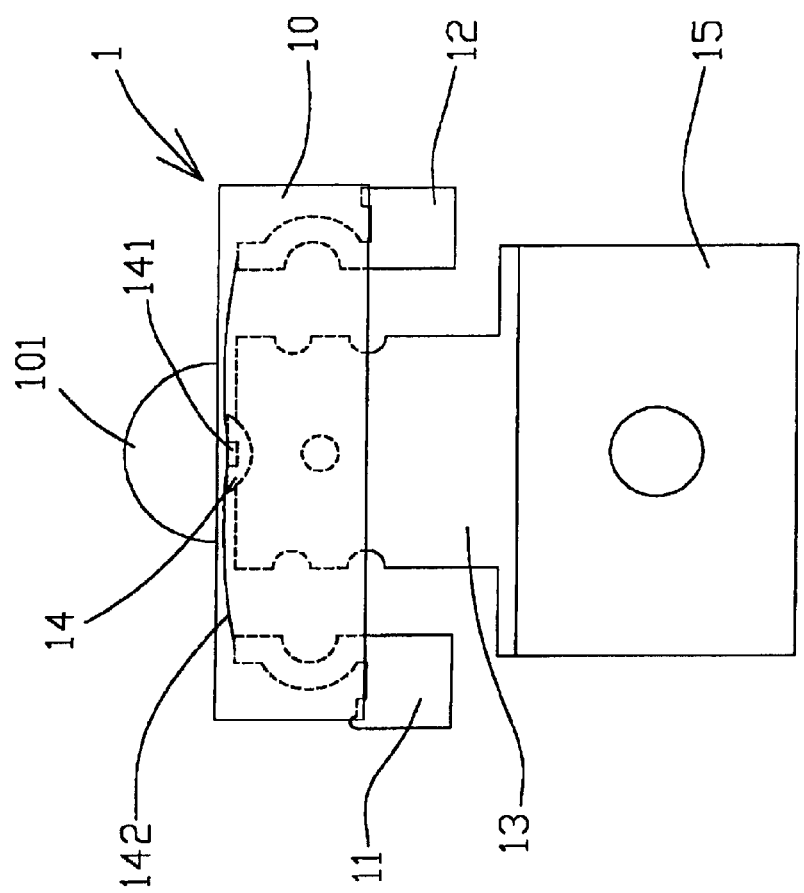
FIG. 2 is a top plan view of the LED of the present invention.
Figure 3:
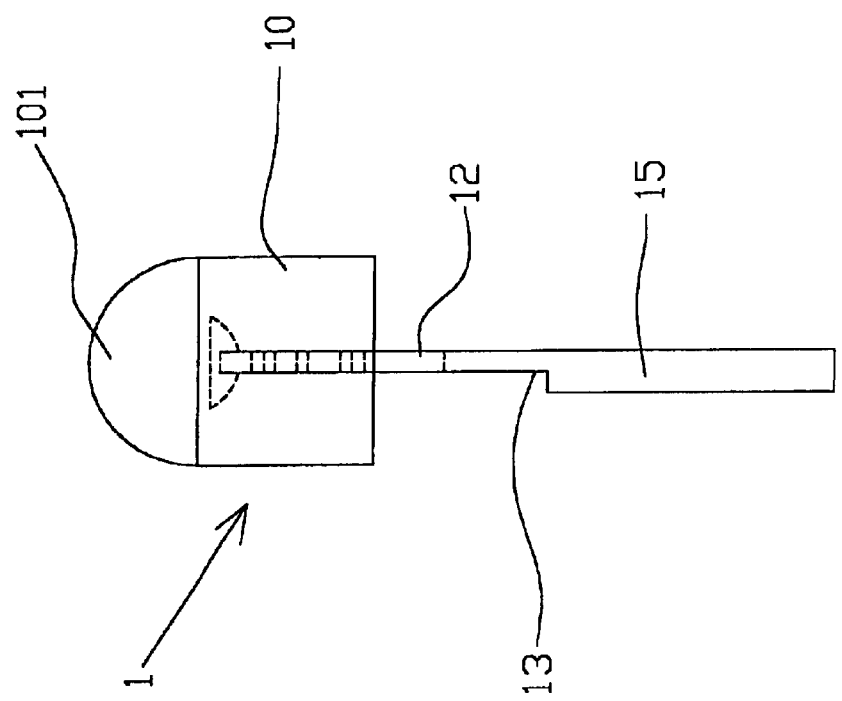
FIG. 3 is a side elevational view of the LED of the present invention.

With reference to the drawings and in particular to FIGS. 1–3, a sideway-projecting light emitting diode (LED) constructed in accordance with the present invention, generally designated with reference numeral 1, comprises an enclosure 10 made of a light transmitting material. The enclosure 10 has a side face (not labeled) on which a light-focusing portion 101 is formed. First and second terminals 11, 12 are mounted in the enclosure 10 and has tails (not labeled) extending beyond an opposite side face (not labeled) of the enclosure 10. The terminals 11, 12 are made of conductive materials, such as metal including aluminum, copper and iron, and are respectively functioning as positive and negative terminals of the LED 1.

A support member 13, in the form of a plate, is mounted in the enclosure 10 and located between the first and second terminals 11, 12. The support member 13 is made of a conductive material, such as metal including aluminum, copper and iron, and is physically and electrically connected to one of the first and second terminals 11, 12 inside the enclosure 10.

A bowl or receptacle 14 is formed on an inner end of the support member 13 to receive and retain therein a chip 141 which is electrically connected to the first and second terminals 11, 12 by leads 142. The bowl 14 is substantially opposite to and confronting the light-focusing portion 101 of the enclosure 10 whereby the light emitted from the chip 141 is guided through the light-focusing portion 101. A heat dissipation plate 15 is mounted to a remote end of the support member 13 that projects beyond the side face of the enclosure 10. Preferably, the heat dissipation plate 15 is integrally formed with the support member 13. If desired, the heat dissipation plate 15 may has a thickness different from that of the support member 13 whereby a step-like connection is formed between the support member 13 and the heat dissipation plate 15 as shown in FIG. 3

Figure 4:
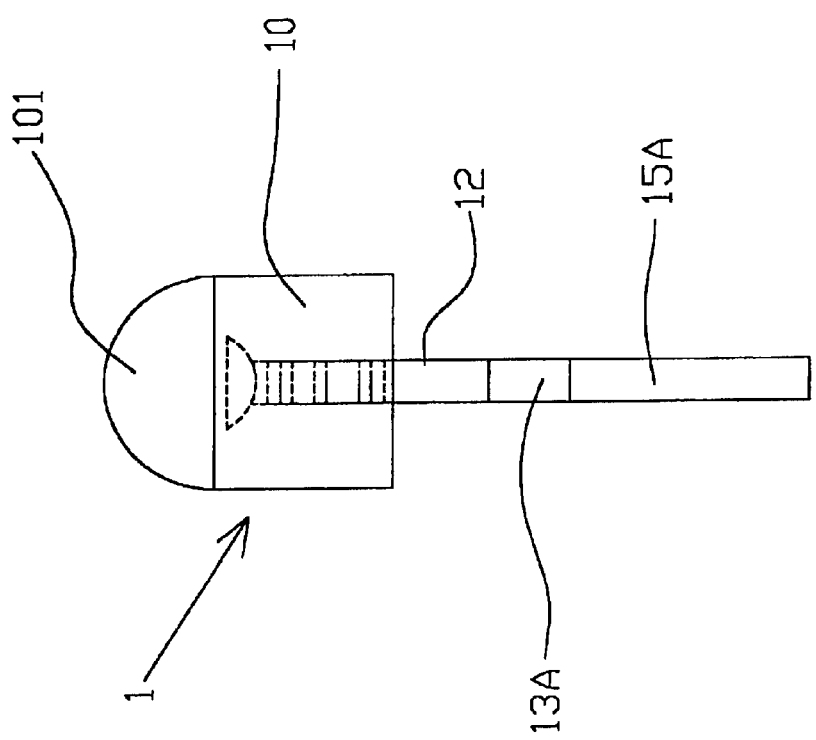
FIG. 4 is a side elevational of an LED constructed in accordance with another embodiment of the present invention.

It is apparent to those having ordinary skills to make the support member and the heat dissipation plate having the same thickness. This is illustrated in another embodiment shown in FIG. 4, wherein the support frame that is designated with reference numeral 13A for distinction is mounted in the enclosure 10, having an inner end forming a bowl inside the enclosure 10 and facing the light-focusing portion 101 of the enclosure 10 and a remote end extending beyond the side face of the enclosure 10. A heat dissipation plate 15A having the same thickness as the support member 13A is integrally formed with the remote end of the support member 13A.

Figure 5:
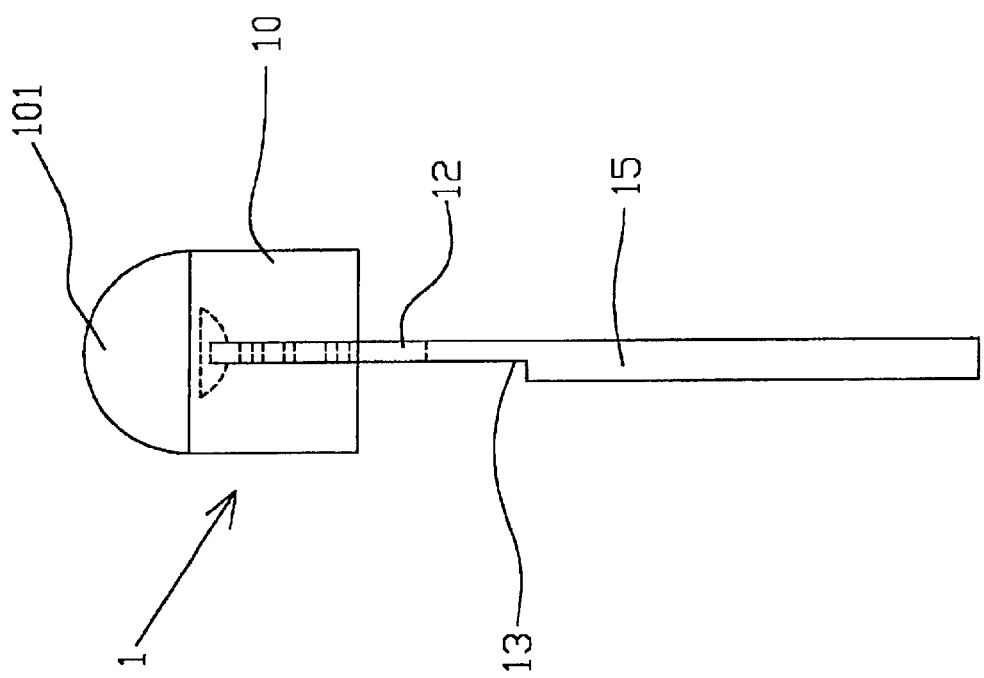
FIG. 5 is a side elevational of an LED constructed in accordance with a further embodiment of the present invention.

It is also apparent to those having ordinary skills to make the heat dissipation plate having a different size and shape from that illustrated in FIGS. 1–4. This is illustrated in a further embodiment shown in FIG. 5, wherein the support frame 13 is mounted in the enclosure 10, having an inner end forming a bowl inside the enclosure 10 and facing the light-focusing portion 101 of the enclosure 10 and a remote end extending beyond the side face of the enclosure 10. A heat dissipation plate 15B having a size larger than that of the heat dissipation plate 15 or 15A shown in FIGS. 1–4 is integrally formed with the remote end of the support member 13. The large size of the heat dissipation plate 15B allows for enhanced heat dissipation, which in turn allows for increased power consumption of the LED 1 for emitting light of great brightness.

Figure 6:
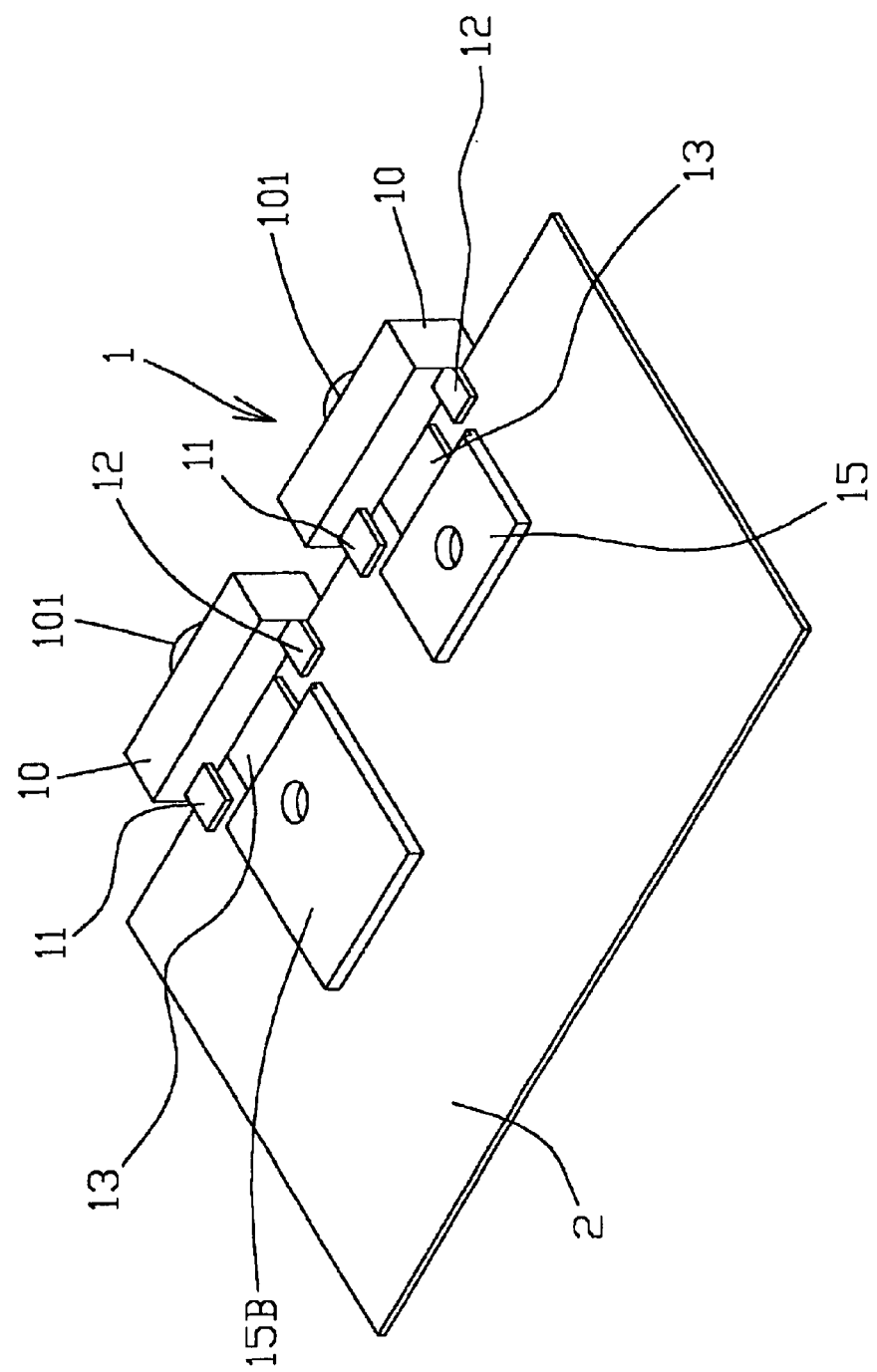
FIG. 6 is a perspective view showing an application of the LED of the present invention wherein two LEDs are edge-mounted to an edge of a circuit board for projection of light in a sideway direction with respect to the circuit board.
Figure 7:
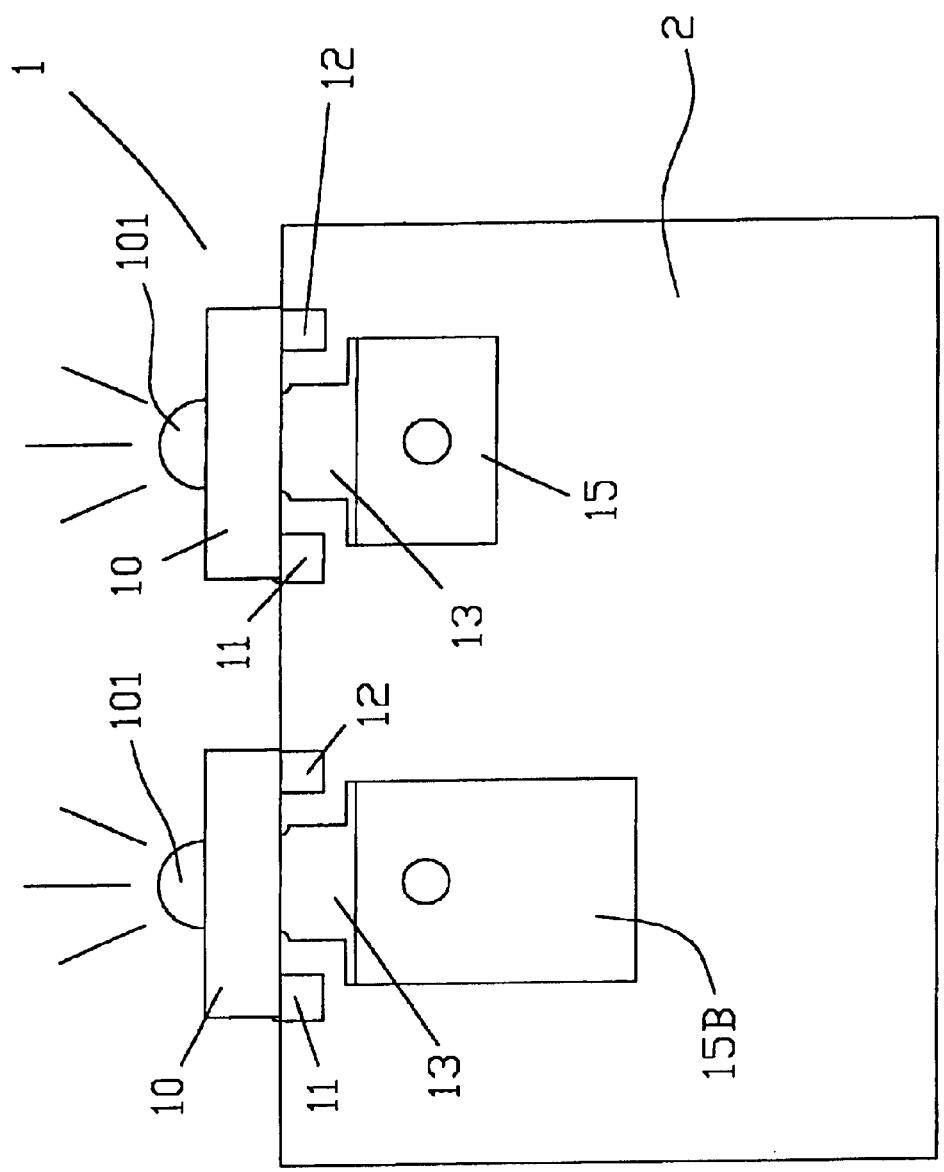
FIG. 7 is a top plan view of FIG. 6.

Also referring to FIGS. 6 and 7, an application of the LED 1 of the present invention is shown. Two LEDs 1, one having a small heat dissipation plate 15 and the other having, a large heat dissipation plate 15B, are edge-mounted to an edge of a circuit board 2. The terminals 11, 12 of the LEDs 1 are located inboard the circuit board 2 with the enclosures 10 of the LEDs 1 located outside the circuit board 2. The terminals 11, 12 are soldered to the circuit board 2 for electrical connection with and mechanically fixing to the circuit board 2. The heat dissipation plates 15, 15B are selectively soldered to the circuit board 2. When the circuit board 2 supplies an electrical current through the LEDs 1, the current flows through the terminals 11, 12 and the chip 141 enclosed in the enclosures 10 to emit and project light through the light-focusing portions 101 in a sideway direction with respect to the circuit board 2. The heat dissipation plates 15, 15B help removing heat from the enclosures 10 of the LEDs 1.

Figure 8:
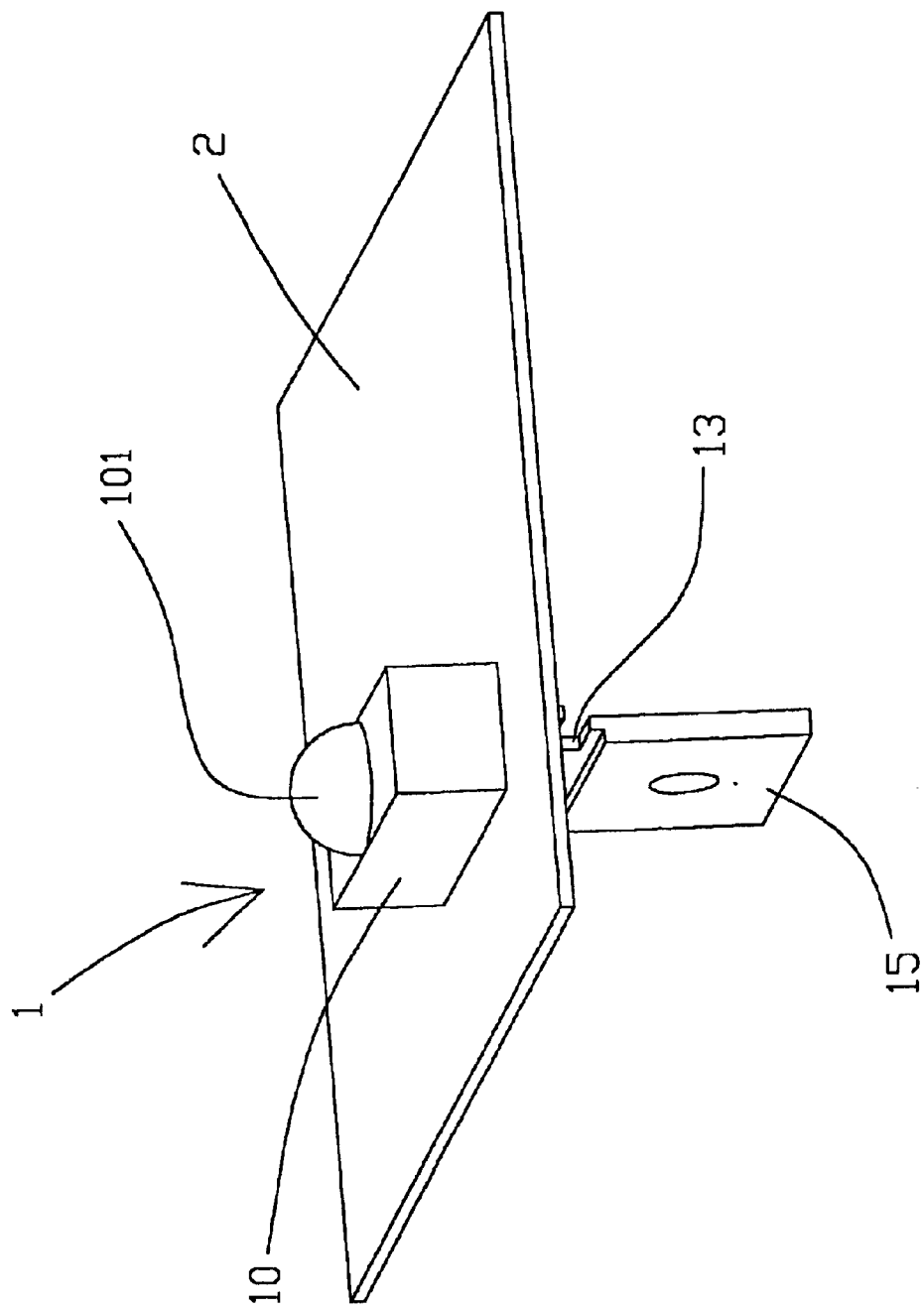
FIG. 8 is a perspective view showing another application of the LED of the present invention wherein the LED is mounted to the circuit board in a standing manner with the heat dissipation member extending beyond an opposite side of the circuit board.
Figure 9:
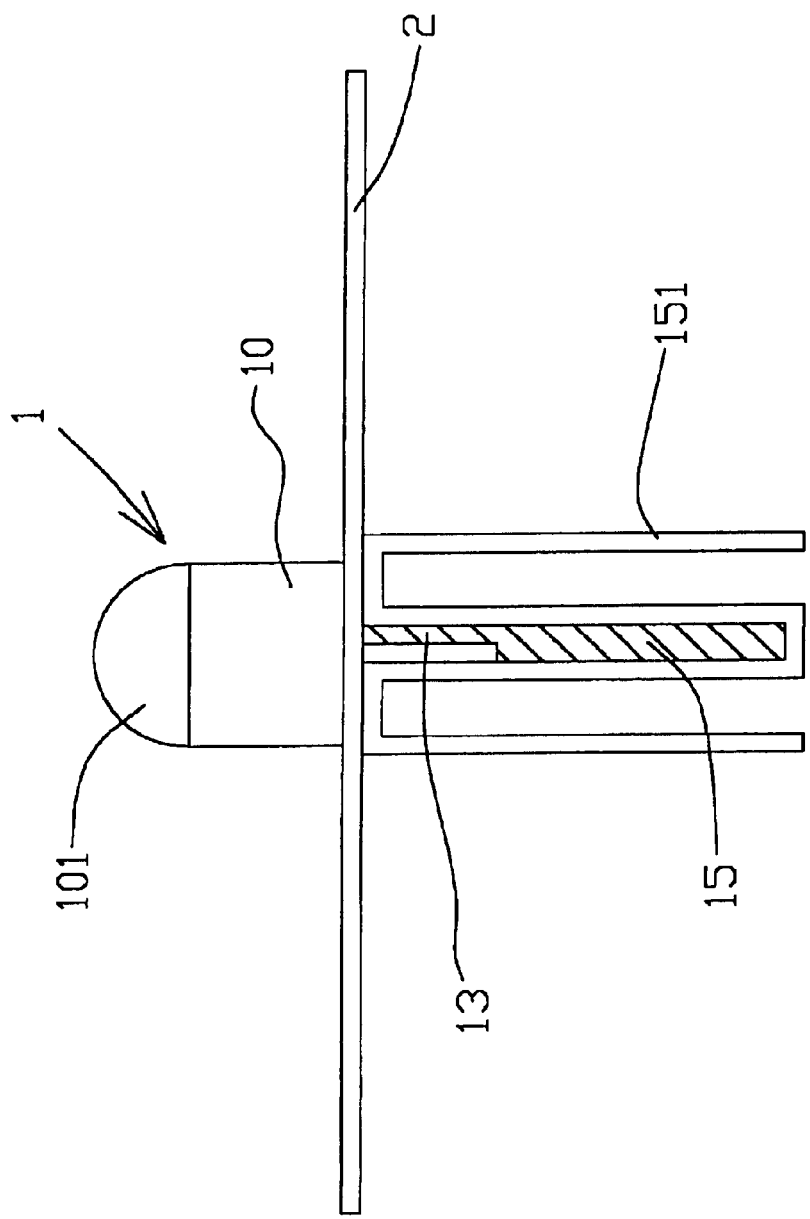
FIG. 9 is a side elevational view showing a further application of the LED of the present invention to which an additional heat dissipation member is attached to the LED for even enhanced heat dissipation.

FIG. 8 shows another application of the LED 1 of the present invention wherein the LED 1 is mounted to a circuit board 2 in a standing manner on a major surface of the circuit board 2. The terminals 11, 12 are soldered to the circuit board 2. The remote end of the support member 13 extends beyond an opposite major surface of the circuit board 2 with the heat dissipation plate 15 located on an opposite side of the circuit board 2. If desired, an additional heat dissipation member 151 may be attached to the heat dissipation plate 15 as shown in FIG. 9 for enhancing the heat dissipation of the LED 1.

Figure 10:
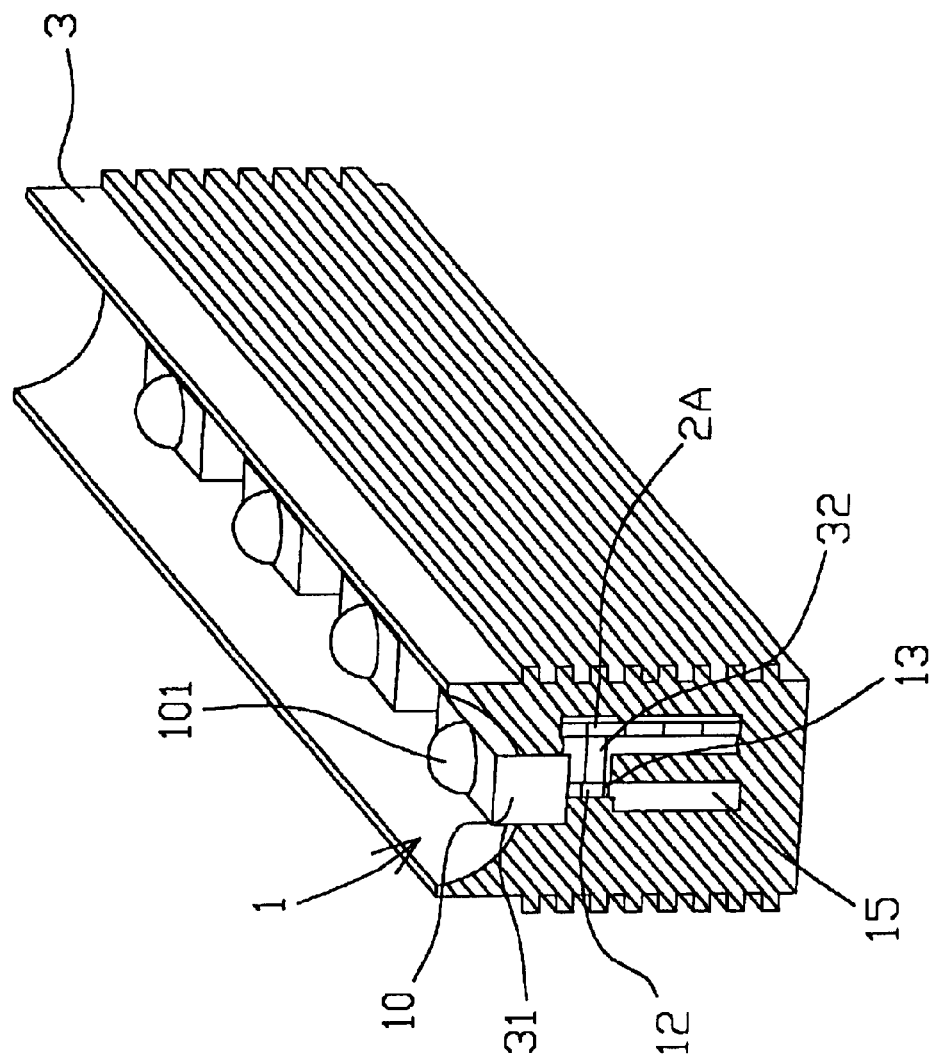
FIG. 10 is a perspective view showing a further application of the LED of the present invention, wherein a number of LEDs are mounted in a metal casing as a light tube.
Figure 11:
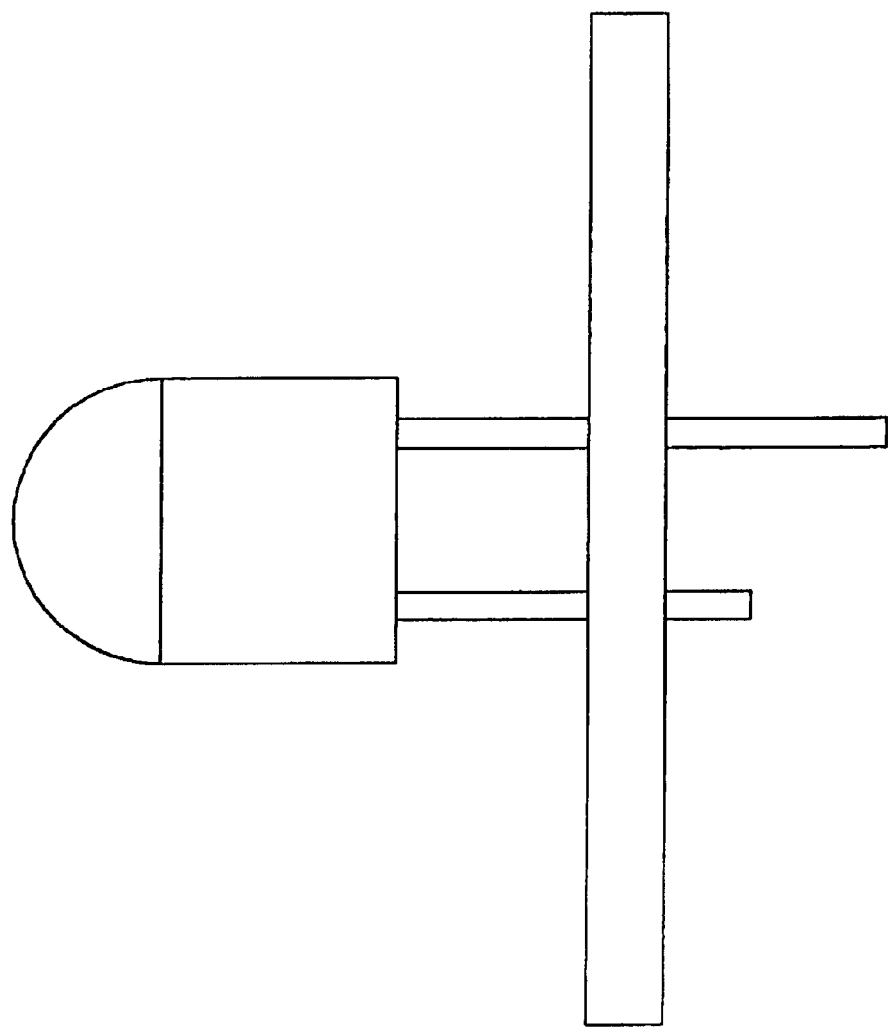
FIG. 11 is a side elevational view of a conventional light emitting diode mounted to a circuit board.
Figure 12:
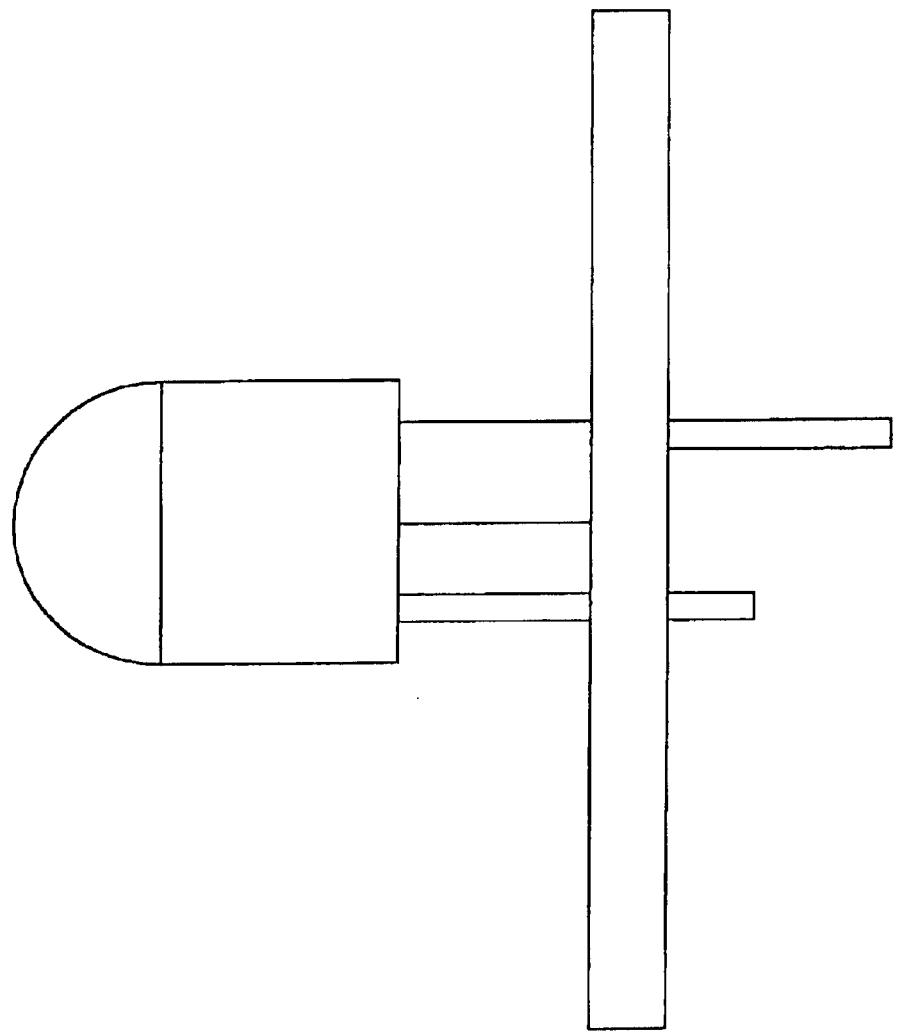
FIG. 12 is a side elevational view of another conventional light emitting diode mounted to a circuit board.
Figure 13:
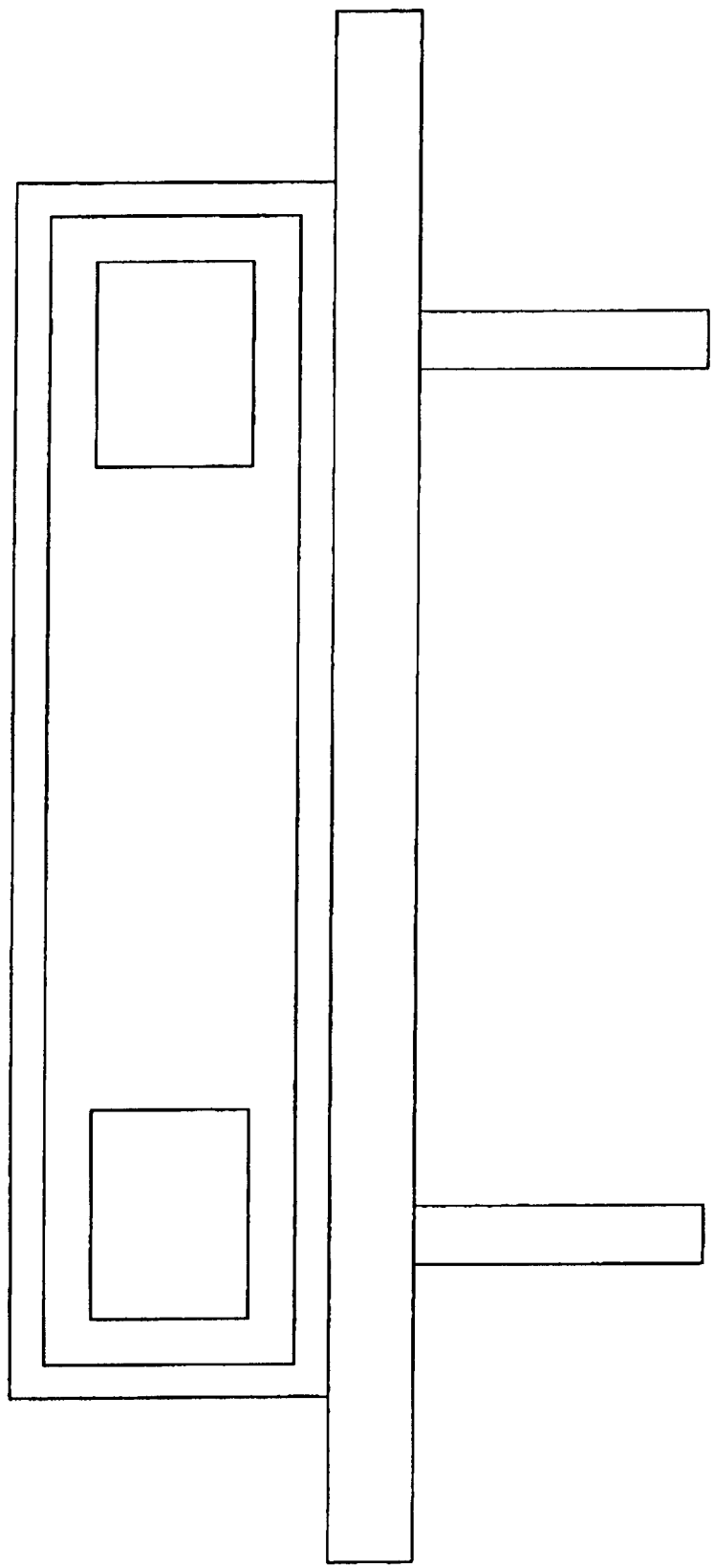
FIG. 13 is a side elevational view of a further conventional light emitting diode mounted to a circuit board.
Figure 14:
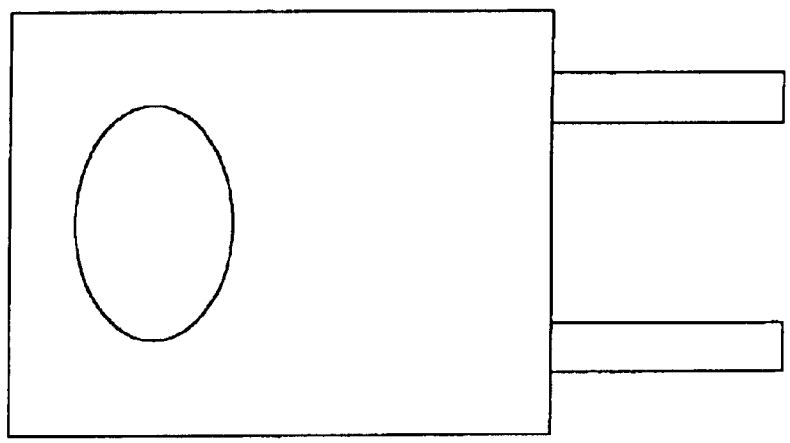
FIG. 14 is a side elevational view of yet a further conventional light emitting diode.

FIG. 10 shows a further application of the LED 1 of the present invention, wherein a number of LEDs 1 are arranged in a side by side manner inside a casing 3 made of a conductive material, such as metal including aluminum, copper and iron. An example of the casing 3 is an aluminum-extruded member defining a lengthwise-extending slot 31 in which the side-by-side arranged LEDs 1 are received and retained. The terminals 11, 12 and the heat dissipation plates 15 are received in the casing 3 with the light-focusing portions 101 of the LEDs 1 exposed through an open top of the casing 3. A circuit board 2A is fixed inside the casing 3 and is electrically connected to the terminals 11, 12 of the LEDs 1 by means of suitably arranged conductors 32. This arrangement forms a light tube comprised of a number of LEDs 1. The casing 3, as well as the plates 15, helps heat dissipation from the LEDs 1 and thus allowing for large power consumption and great brightness.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A light emitting diode comprising:
    at least one LED assembly having:
        a) an enclosure having first and second opposing faces and a light focusing portion formed on the first opposing face, the enclosure being made from a light emitting material;
        b) a support member having a bowl formed at a first end and a single flat heat dissipation plate without fins formed at a second end, the bowl being positioned within the enclosure with the support member extending outwardly through the second opposing face, the heat dissipation plate being spaced apart from the enclosure by the support member, the support member and the heat dissipation plate being perpendicular to the second opposing face;

c) a first terminal and a second terminal extending through and being perpendicular to the second opposing face for connecting to a power supply, the support member, the heat dissipation plate, the first terminal and the second terminal extend from the second opposing face of the enclosure in a common direction, each terminal being made of conductive material; and d) a chip connected to the bowl, the chip being electrically connected to the first terminal and the second terminal.

2. The light emitting diode according to claim 1, wherein the support member is electrically connected to one of the first and second terminals.

3. The light emitting diode according to claim 1, wherein the support member and the heat dissipation plate have different thicknesses.

4. The light emitting diode according to claim 1, wherein the support member and the heat dissipation plate have the same thickness.

5. The light emitting diode according to claim 1, further comprising a heat dissipation member having a plurality of fins connected to the heat dissipation plate.

6. The light emitting diode according to claim 1, further comprising:

a heat dissipating casing having a slot, wherein the terminals of a plurality of LED assemblies are electrically connected to a circuit board, the circuit board and heat dissipation plate being positioned within the heat dissipating casing, the plurality of LED assemblies are spaced apart within the slot of the heat dissipating casing such that the light focusing portion of each LED assembly is external to the heat dissipating casing.

* * * * *